US 6,656,371 B2

(12) United States Patent
Drewes

(10) Patent No.: US 6,656,371 B2
(45) Date of Patent: Dec. 2, 2003

(54) METHODS OF FORMING MAGNETORESISITIVE DEVICES

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 09/966,699

(22) Filed: Sep. 27, 2001

(65) Prior Publication Data

US 2003/0059958 A1 Mar. 27, 2003

(51) Int. Cl.[7] .............................................. G11B 5/127
(52) U.S. Cl. .................. 216/22; 41/46; 41/75; 41/88; 41/100; 204/192.34
(58) Field of Search ............................. 216/22, 38, 41, 216/67, 72, 75, 88, 100, 46; 438/3, 692, 696, 720, 754; 204/192.34

(56) References Cited

U.S. PATENT DOCUMENTS

| | | | | |
|---|---|---|---|---|
| 4,396,479 A | * | 8/1983 | Jones .................... 204/192.32 |
| 4,528,066 A | * | 7/1985 | Merkling et al. ........... 438/696 |
| 5,100,505 A | * | 3/1992 | Cathey, Jr. ................. 438/695 |
| 5,393,376 A | * | 2/1995 | Chen et al. .................... 216/22 |
| 5,438,747 A | * | 8/1995 | Krounbi et al. .......... 29/603.16 |
| 5,607,599 A | * | 3/1997 | Ichihara et al. ............... 216/22 |
| 5,867,890 A | * | 2/1999 | Hsiao et al. .............. 29/603.14 |
| 6,024,885 A | * | 2/2000 | Pendharkar et al. .......... 216/22 |
| 6,261,468 B1 | * | 7/2001 | Sato et al. ..................... 216/22 |
| 6,315,875 B1 | * | 11/2001 | Sasaki .................... 204/192.34 |
| 6,426,012 B1 | * | 7/2002 | O'Sullivan et al. ........... 216/22 |

OTHER PUBLICATIONS

Silicon Processing For The VLSI Era; pp. 666–667, 1992.
Ion Beam Etching (Ion Milling); pp. 1–2; http://insti.physics.sunysb.edu/~zheng/research/ion_milling.html, 8/01.
PETS Inc., (Plasma Equipment Technical Services) Ion Milling System; pp. 1–2; http://pleqtecser.com/prod05.htm, 8/01.
PETS Inc., (Plasma Equipment Technical Services) Plasma ETCH Systems; pp. 1–2; http://pleqtecser.com/prod05.htm, 8/01.

* cited by examiner

Primary Examiner—Anita Alanko
(74) Attorney, Agent, or Firm—Wells St. John P.S.

(57) ABSTRACT

The invention includes a method of forming a magnetoresistive device. A stack is formed. The stack comprises a first magnetic layer, a second magnetic layer, and a non-magnetic layer between the first and second magnetic layers. At least one of the first magnetic layer, second magnetic layer, and non-magnetic layer is etched with a primarily physical etch process in a reaction chamber to expose a portion of the etched layer. While the stack remains in the reaction chamber, a protective material is deposited over the exposed portion.

39 Claims, 4 Drawing Sheets

US 6,656,371 B2

METHODS OF FORMING MAGNETORESISITIVE DEVICES

TECHNICAL FIELD

The invention pertains to methods of making magnetoresistive memory devices, such as, for example, magnetic random access memory (MRAM) devices.

BACKGROUND OF THE INVENTION

Numerous types of digital memories are utilized in computer system components, digital processing systems, and other applications for storing and retrieving data. MRAM is a type of digital memory in which digital bits of information comprise alternative states of magnetization of magnetic materials in memory cells. The magnetic materials can be thin ferromagnetic films. Information can be stored and retrieved from the memory devices by inductive sensing to determine a magnetization state of the devices, or by magnetoresistive sensing of the magnetization states of the memory devices. It is noted that the term "magnetoresistive device" characterizes the device and not the access method, and accordingly a magnetoresistive device can be accessed by, for example, either inductive sensing or magnetoresistive sensing methodologies.

A significant amount of research is currently being invested in magnetic digital memories, such as, for example, MRAM's, because such memories are seen to have significant potential advantages relative to the dynamic random access memory (DRAM) components and static random access memory (SRAM) components that are presently in widespread use. For instance, a problem with DRAM is that it relies on power storage within capacitors. Such capacitors leak energy, and must be refreshed at approximately 15 nanosecond intervals. The constant refreshing of DRAM devices can drain energy from batteries utilized to power the devices, and can lead to problems with lost data since information stored in the DRAM devices is lost when power to the devices is shut down.

SRAM devices can avoid some of the problems associated with DRAM devices, in that SRAM devices do not require constant refreshing. Further, SRAM devices are typically faster than DRAM devices. However, SRAM devices take up more semiconductor real estate than do DRAM devices. As continuing efforts are made to increase the density of memory devices, semiconductor real estate becomes increasingly valuable. Accordingly, SRAM technologies are difficult to incorporate as standard memory devices in memory arrays.

MRAM devices have the potential to alleviate the problems associated with DRAM devices and SRAM devices. Specifically, MRAM devices do not require constant refreshing, but instead store data in stable magnetic states. Further, the data stored in MRAM devices can potentially remain within the devices even if power to the devices is shutdown or lost. Additionally, MRAM devices can potentially be formed to utilize less than or equal to the amount of semiconductor real estate associated with DRAM devices, and can accordingly potentially be more economical to incorporate into large memory arrays than are SRAM devices.

Although MRAM devices have potential to be utilized as digital memory devices, they are currently not widely utilized. Several problems associated with MRAM technologies remain to be addressed. It would be desirable to develop improved methodologies for making MRAM devices.

SUMMARY OF THE INVENTION

In one aspect, the invention encompasses a method of forming a magnetoresistive device. A stack is formed, with the stack comprising a first magnetic layer, a second magnetic layer, and a non-magnetic layer between the first and second magnetic layers. At least one of the first magnetic layer, second magnetic layer, and non-magnetic layer is etched with a primarily physical etch process in a reaction chamber to expose a portion of the etched layer. While the stack remains in the reaction chamber, a protective material is deposited over the exposed portion.

In another aspect, the invention encompasses another method of forming a magnetoresistive device. A stack is provided. The stack comprises a first magnetic layer, a non-magnetic layer over the first magnetic layer, and a second magnetic layer over the non-magnetic layer. The second magnetic layer is etched with a primarily physical etch process in a reaction chamber to pattern the second magnetic layer into a block having at least one exposed sidewall. While the stack remains in the reaction chamber, a protective material is deposited over the at least one exposed sidewall.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
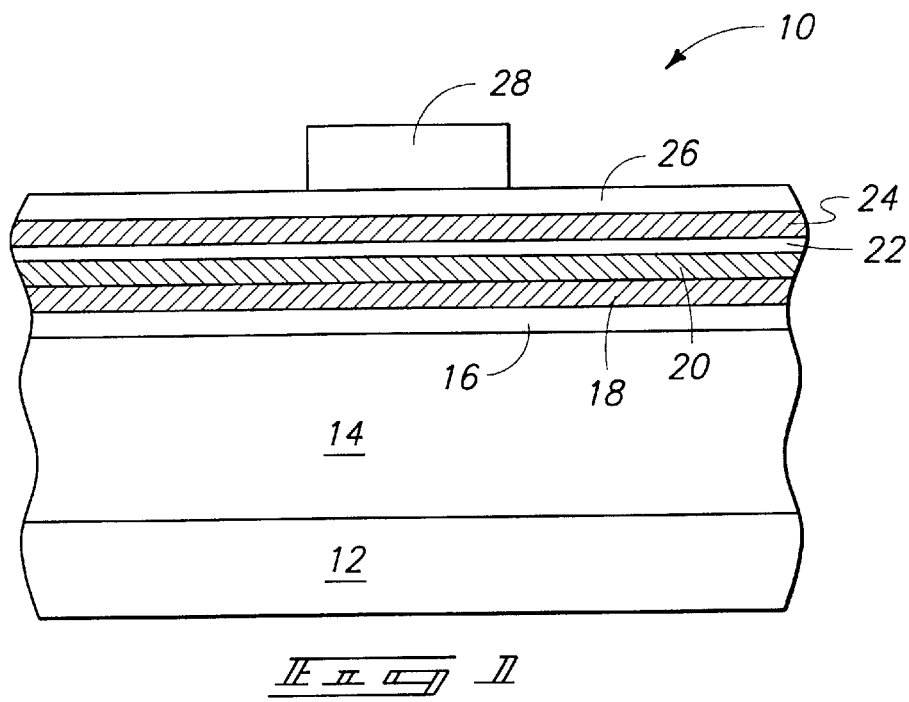
FIG. 1 is a diagrammatic, cross-sectional view of a semiconductor wafer fragment at a preliminary processing step of a method of the present invention.

An exemplary method of the present invention is described with reference to FIGS. 1–4. Referring initially to FIG. 1, a fragment of a semiconductor wafer 10 is illustrated at a preliminary process step. The fragment of wafer 10 comprises a semiconductive material substrate 12. Substrate 12 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative layer 14 is formed over substrate 12. Layer 14 can comprise, for example, silicon dioxide formed by chemical vapor deposition of tetraethyl orthosilicate (TEOS). Layer 14 can be formed to a thickness of, for example, about 6,000 Å.

A barrier layer 16 is formed over layer 14, and can comprise, for example, tantalum.

A magnetic pinning layer 18 is formed over layer 16, and can comprise, for example, nickel and iron.

A magnetic layer 20 having "soft" magnetic properties is formed over layer 18, and can comprise, for example, one or more of nickel, iron, cobalt, iridium, platinum, ruthenium, and manganese; and in particular embodiments will comprise cobalt and iron. Layer 20 can be referred to as a "pinned" layer, in that a magnetic orientation within layer 20 can be pinned by layer 18.

A non-magnetic layer 22 is formed over magnetic layer 20. Nonmagnetic layer 22 can comprise either an electrically conductive material (such as copper) or an electrically non-conductive material (such as silicon dioxide or aluminum oxide, $Al_2O_3$). Layer 22 can have a thickness of, for example, about 15 Å.

A magnetic layer 24 is formed over non-magnetic layer 22. Layer 24 preferably comprises a material having "soft" magnetic properties, such as a material comprising one or more of nickel, iron, cobalt, iridium, platinum, ruthenium and manganese; and in particular embodiments will comprise a material containing nickel and iron. Magnetic layer 24 can comprise the same chemical composition as layer 20, or can comprise a different chemical composition. Magnetic layer 24 can have a magnetic orientation that is either parallel to the pinned magnetic orientation within layer 20, or antiparallel to the magnetic orientation within layer 20. A magnetoresistive memory device is ultimately formed to comprise layers 20 and 24, and information is stored in such device as a direction of the magnetic orientation within layer 24 relative to the magnetic orientation within layer 20. Specifically, if the magnetic orientation within layer 24 is antiparallel to the magnetic orientation within layer 20, such corresponds to a first memory state; and if the magnetic orientation within layer 24 is parallel to the magnetic orientation within layer 20, such corresponds to a second memory state which is different than the first memory state.

A mass 26 is provided over magnetic material 24. Mass 26 can comprise, for example, tantalum.

Layers 18, 20, 22 and 24 can be referred to as an MRAM stack. In particular embodiments, layers 20 and 24 can be referred to as first and second magnetic layers, respectively, which are separated from one another by an intervening non-magnetic layer 22. In the shown construction, layer 18 is over and in physical contact with layer 16; layer 20 is over and in physical contact with layer 18; layer 22 is over and in physical contact with layer 20; and layer 24 is over and in physical contact with layer 22. Further, layer 16 is shown over and in physical contact with insulative material 14. It is to be understood, however, that intervening materials could be provided between one or more of the shown layers. For instance, a copper layer could be provided between layers 14 and 16. In such constructions, a copper-containing mass would typically be provided over oxide 14, and an insulative mass (such as, for example, silicon nitride), would typically be provided between the copper-containing mass and the tantalum-containing layer 16.

A patterned photoresist block 28 is provided over mass 26. Photoresist block 28 can be formed by conventional photolithographic processing.

Figure 2:
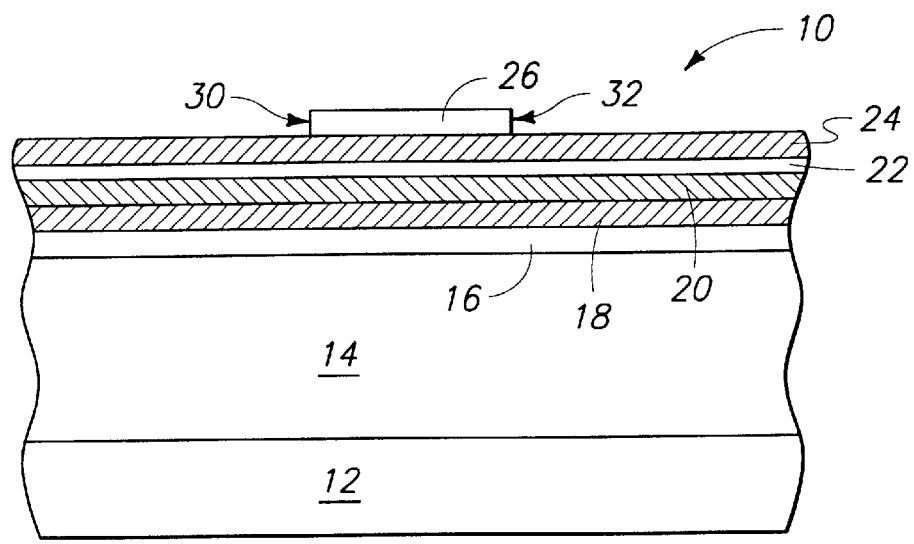
FIG. 2 is a view of the FIG. 1 wafer fragment shown at a processing step subsequent to that of FIG. 1.

Referring to FIG. 2, a pattern is transferred from photoresist block 28 (FIG. 1) to mass 26. Patterned mass 26 comprises sidewall edges 30 and 32 which together define a patterned outer periphery of mass 26. Mass 26 can be referred to as a hard masking material. Further, mass 26 can be referred to as a patterned block. It is to be understood that if mass 26 is referred to as a patterned block such does not imply any particular geometry of the mass, and specifically that a patterned block 26 can comprise any of numerous outer peripheral shapes, including circular shapes, elliptical shapes, and rectangular peripheral shapes. The outer peripheral shape of block 26 is only partially shown in the cross-sectional view of FIG. 2. The full peripheral shape would typically be observable from a top view (not shown).

Figure 3:
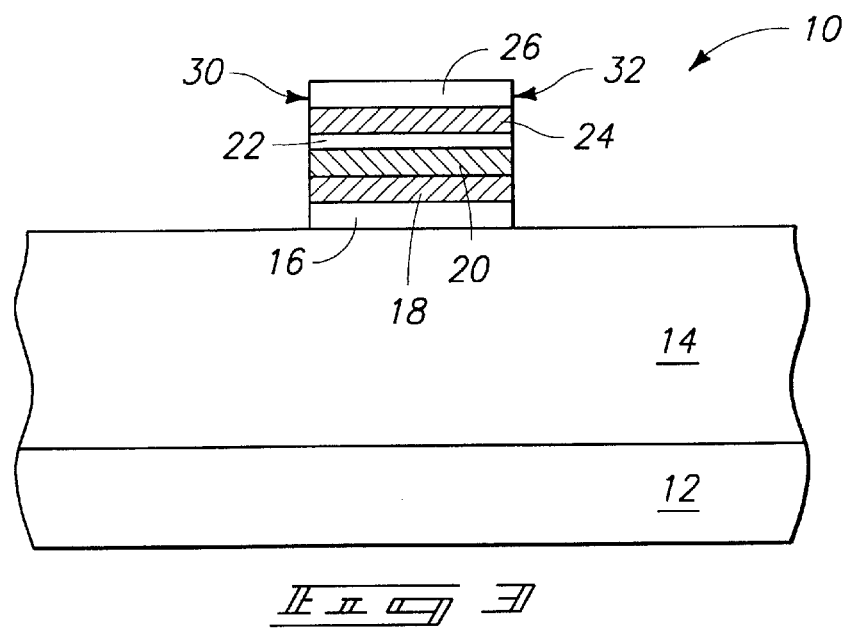
FIG. 3 is a view of the FIG. 1 wafer fragment shown at a processing step subsequent to that of FIG. 2.

Referring to FIG. 3, the outer peripheral pattern of mass 26 is transferred to layers 16, 18, 20, 22 and 24. Such exposes sidewall portions of layers 16, 18, 20, 22 and 24 which are coextensive with the peripheral outer sidewalls 30 and 32 of patterned mass 26. The etching of layers 16, 18, 20, 22 and 24 occurs through a primarily physical etch process. The etch process is referred to as a "primarily physical" etch process to distinguish the process from chemical-based etch processes. An exemplary physical etch process is an ion milling process, wherein non-reactive ions (such as, for example, positively charged argon ions) are impacted against a material to remove the material. A process is described herein as being "primarily" a physical etch process if the majority of material removed by the etch process is removed by physical etching. Various etch processes are known in which both chemical etching and physical etching occur simultaneously (such as, for example reactive ion etching). Such processes can constitute a primarily physical etch process if the majority of removed material is removed by physical etching, rather than chemical etching.

Figure 8:
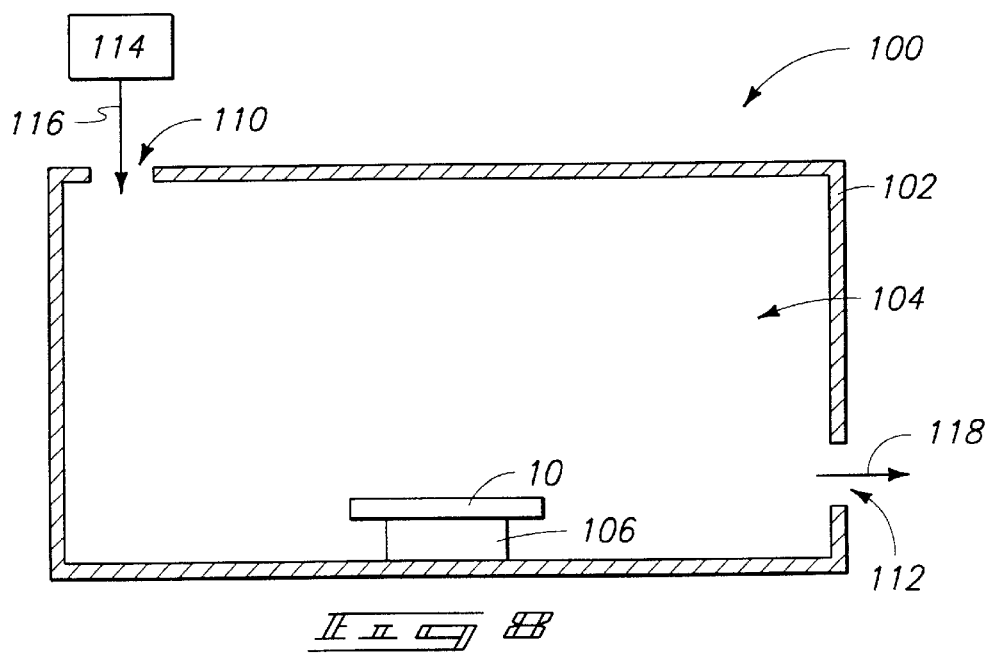
FIG. 8 is a diagrammatic, sectional view of an exemplary reaction chamber which can be utilized in methodology of the present invention.

Physical etching typically occurs within a reaction chamber, with an exemplary reaction chamber illustrated in FIG. 8 as a chamber 102 within an apparatus 100. Reaction chamber 102 has an interior 104 within which wafer 10 is supported on a substrate holder 106. In operation, ions (not shown in FIG. 8) are generated and impacted against a surface of wafer 10 to etch materials from the surface.

Figure 4:
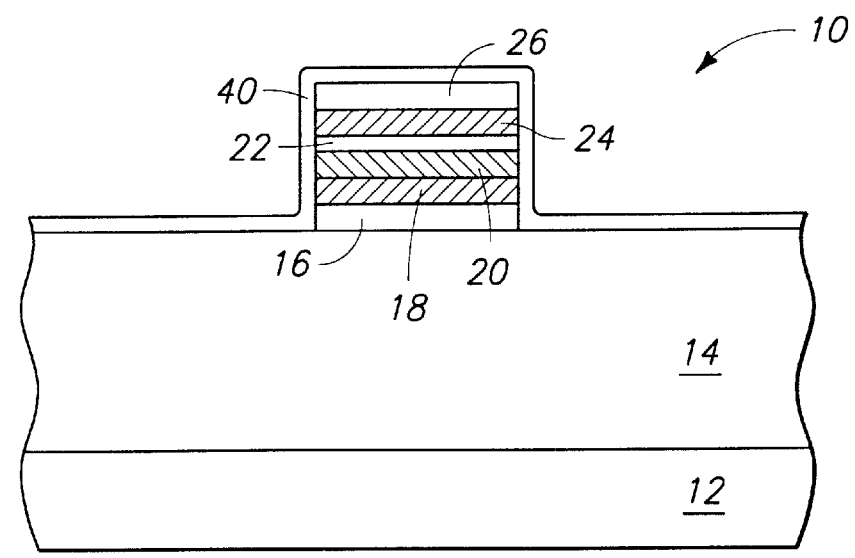
FIG. 4 is a view of the FIG. 1 wafer fragment shown at a processing step subsequent to that of FIG. 3.

A problem which can occur in conventional processes for etching the stacked materials of FIG. 3 is that exposed surfaces of several of the materials will readily oxidize in an atmosphere comprising a source of oxygen. Accordingly, it would be desirable to form a protective layer over the exposed sidewall surfaces of the stack comprising layers 16, 18, 20, 22 and 24 before the exposed surfaces of the stack contact oxygen or other reactive materials. Referring to FIG. 4, a protective material 40 is shown formed over the layers 16, 18, 20, 22 and 24 of the stack. Further, protective material 40 extends over an upper surface of patterned mass 26.

Protective material 40 can comprise, for example, silicon, carbon or germanium. In accordance with methodology of the present invention, protective material 40 is preferably formed while wafer 10 is within the same reaction chamber 102 of FIG. 8 that had been utilized for the physical etching. Specifically, reaction chamber 102 is illustrated to comprise an inlet port 110 and an outlet port 112, and further to comprise a precursor source 114 which flows precursor into chamber 102 through inlet port 110 (illustrated by arrow 116). The precursor can comprise a material associated with chemical vapor deposition, such as, for example, silane for chemical vapor deposition of a silicon material; a volatile germanium-containing compound for deposition of a germanium-containing material; or one or more of acetylene, ethylene and methane for deposition of a carbon material. Alternatively, the precursor can comprise a mixture of $SiH_2$ and $NH_3$ for deposition of a protective material 40 (FIG. 4) comprising silicon nitride. Unreacted precursor, together with reaction products, are flowed out of outlet port 112 (as illustrated by arrow 118). Protective material 40 can be formed under exemplary conditions wherein silane is utilized to form a silicon-containing protective material 40, a pressure within chamber 102 is maintained at or below 1 Torr; and a temperature of wafer 10 is maintained within a range of from about 0° C. to about 250° C. Alternatively, protective material 40 can be formed under exemplary conditions wherein ethylene is utilized to form a carbon-containing protective material 40, a pressure within chamber 102 is maintained at or below 100 mTorr; and a temperature of wafer 10 is maintained within a range of from about 0° C. to about 250° C.

Referring again to FIG. 4, protective material 40 can be formed to have a thickness of, for example, greater than 50 Å, such as, for example, a thickness of from about 50 Å to about 1,000 Å, with a preferred thickness being about 100 Å. Layer 40 can be formed during the physical etching occurring within the reaction chamber 102 of FIG. 8, or after the physical etching is stopped. An advantage of forming protective layer 40 while wafer 10 is within reaction chamber 102 is that the protective material will then be in place prior to any transfer of wafer 10 to other fabrication apparatuses. Accordingly, wafer 10 can be exposed to atmospheric oxygen after removal from chamber 102, which can simplify transfer of wafer 10 to other fabrication apparatuses, relative to transfers which would occur if etched sidewalls of material 16, 18, 20, 22 and 24 remained exposed during transfer of wafer 10 from chamber 102 of FIG. 8.

Generally, ion milling reaction chambers and other reaction chambers associated with physical etch processes can be sealed from a surrounding atmosphere, and suitable conditions can be provided within the chambers for chemical vapor deposition. Accordingly, methodology of the present invention can be readily utilized with conventional physical etching apparatuses. An exemplary apparatus which is suitable for methodology of the present invention is a RIM350™ Ion Mill manufactured by Veeco Instruments Inc.

In the shown embodiment, all of the layers 16, 18, 20, 22 and 24 have sidewalls exposed during a physical etch, and the protective material 40 is shown covering all of the exposed sidewalls. It is to be understood, however, that the invention encompasses other embodiments wherein only some of the sidewalls are exposed during a physical etch process, and further wherein only some of the exposed sidewalls of layers 16, 18, 20, 22 and 24 are covered by a protective material.

Figure 5:
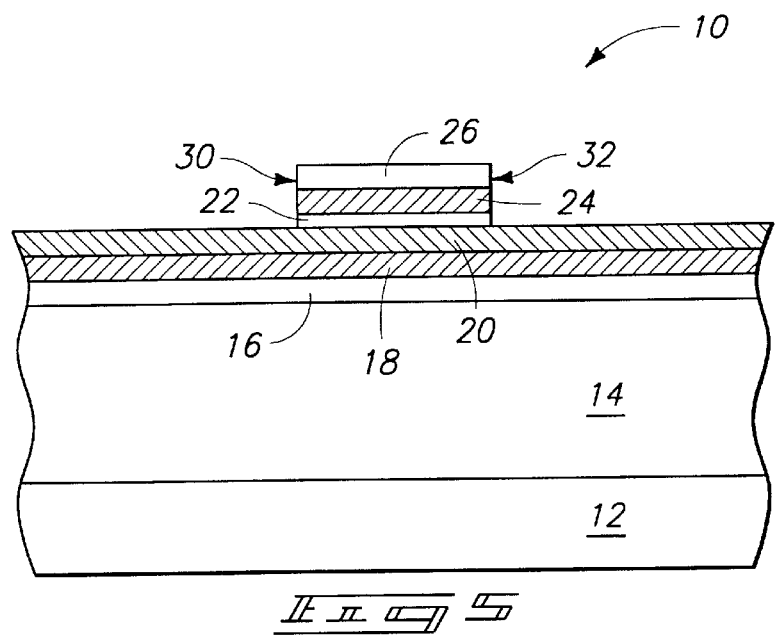
FIG. 5 is a view of the FIG. 1 wafer fragment shown at a processing step subsequent to that of FIG. 2, in accordance with a second embodiment method of the present invention.
Figure 6:
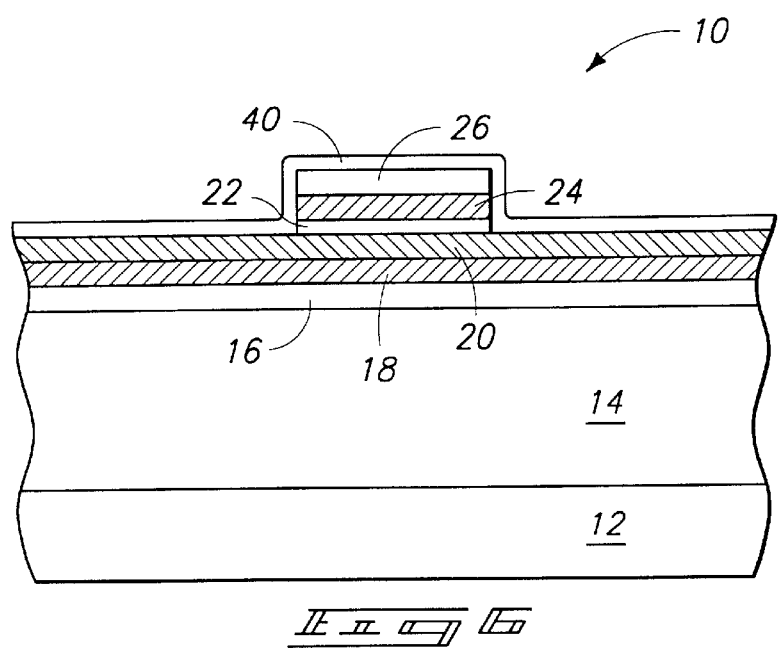
FIG. 6 is a view of the FIG. 5 wafer fragment shown at a processing step subsequent to that of FIG. 5.

An exemplary method in which only some of the sidewalls of materials 16, 18, 20, 22 and 24 are exposed during a physical etch is described with reference to FIGS. 5–7. Referring initially to FIG. 5, the fragment of wafer 10 is illustrated at a processing step subsequent to that of FIG. 2, and specifically is illustrated after a physical etch process has been utilized to transfer a pattern from hard mask 26 to underlying layers 22 and 24. The physical etch has accordingly exposed sidewalls of layers 22 and 24 which are coextensive with the sidewalls 30 and 32 of mask 26, but has not exposed sidewalls of layers 16, 18 and 20. Referring to FIG. 6, the protective material 40 is formed along the exposed sidewalls of materials 22 and 24, but is not formed along any exposed sidewalls of layers 16, 18 and 20. Protective material 40 is preferably formed in accordance with methodology described above with reference to FIG. 4, and specifically is preferably formed in the same reaction chamber utilized for the physical etch which exposed sidewalls of layers 22 and 24.

Figure 7:
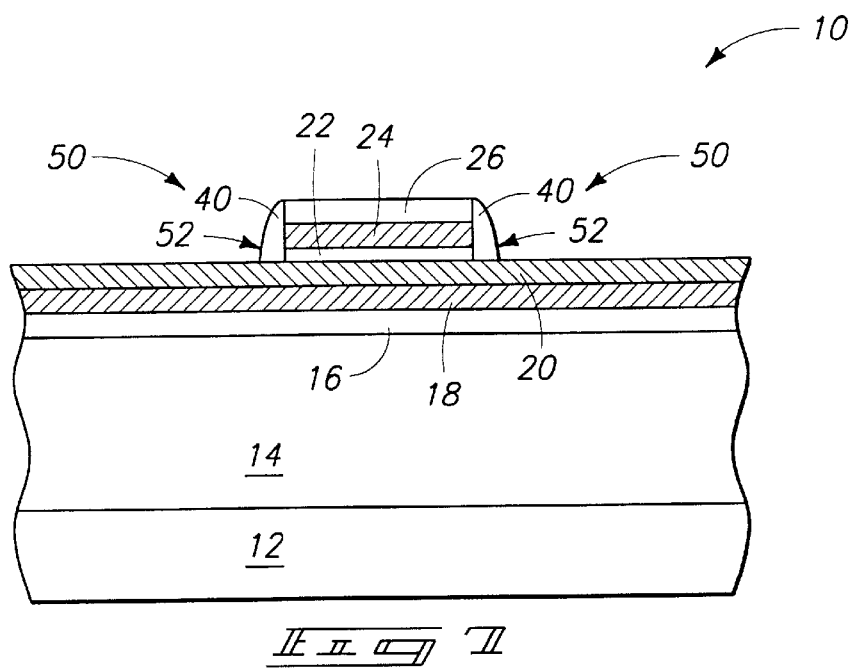
FIG. 7 is a view of the FIG. 5 wafer fragment shown at a processing step subsequent to that of FIG. 6.

The structure illustrated in FIG. 6 can be subjected to further processing which anisotropically etches material 40 to form the sidewall spacers 50 shown in FIG. 7. Sidewall spacers 50 protect sidewalls of layers 22 and 24 from exposure to oxygen or other reactive gases during transfer of wafer 10.

In further processing, sidewall spacers 50 can be considered to define an outer peripheral pattern corresponding to outer peripheral edges 52 of the sidewall spacers. One or more of layers 16, 18 and 20 can be subjected to subsequent etching (not shown) to transfer the outer peripheral pattern of sidewall spacers 50 to one or more of the underlying layers.

Although the methodology described with reference to FIGS. 5–7 is shown patterning layers 22 and 24, while not patterning layers 16, 18 and 20; it is to be understood that the methodology can be utilized for patterning other combinations of the layers of the stack comprising layers 16, 18, 20, 22 and 24. For instance, the methodology can be utilized for patterning layers 20, 22 and 24, while leaving layers 16 and 18 unpatterned; or for patterning layers 18, 20, 22 and 24, while leaving layer 16 unpatterned.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a magnetoresistive device, comprising:

forming a stack comprising first magnetic layer, a non-magnetic layer over the first magnetic layer, and a second magnetic layer, over the non-magnetic layer;

etching at least, the second magnetic layer and the non-magnetic layer in a reaction chamber to expose portions of the second magnetic layer and the non-magnetic layer; and while the stack remains in the reaction chamber, depositing a protective material over the exposed portions.

2. The method of claim 1 wherein the depositing comprises chemical vapor depositing.

3. The method of claim 1 wherein the etching comprises ion milling.

4. The method of claim 3 wherein portions of all three of the layers are exposed by the etching, and wherein the protective material is formed over the exposed portions of all three of the layers.

5. The method of claim 1 wherein the protective material comprises silicon.

6. The method of claim 1 wherein the protective material comprises carbon.

7. The method of claim 1 wherein the protective material comprises germanium.

8. The method of claim 1 wherein the protective material comprises silicon nitride deposited from gaseous precursors comprising $SiH_2$ and $NH_3$.

9. The method of claim 1 wherein the protective material comprises silicon deposited from at least one gaseous precursor; the at least one precursor including silane.

10. The method of claim 1 wherein the protective material comprises carbon deposited from at least one gaseous precursor; the at least one precursor including acetylene, ethylene, or methane.

11. A method of forming a magnetoresistive device, comprising:
   forming a stack comprising a first magnetic layer, a non-magnetic layer over the first magnetic layer, and a second magnetic layer over the non-magnetic layer;
   etching the second magnetic layer and the non-magnetic layer with a primarily physical etch process in a reaction chamber to pattern the second magnetic layer into a block having at least one exposed sidewall and to pattern the non-magnetic layer into a block having at least one exposed sidewall; and
   while the stack remains in the reaction chamber, depositing a protective material over the exposed sidewalls of the second magnetic layer block and the non-magnetic layer block.

12. The method of claim 11 wherein the protective material is formed over the exposed sidewalls of the second magnetic layer block and the non-magnetic layer block to a thickness of from about 50 Å to about 1000 Å.

13. The method of claim 11 further comprising forming a patterned mask over the second magnetic layer before the etching of the second magnetic layer, and wherein the etching transfers a pattern from the mask to the second magnetic layer.

14. The method of claim 13 wherein the protective material is formed over the patterned mask.

15. The method of claim 13 wherein the protective material is formed over the patterned mask to a thickness of from about 50 Å to about 1000 Å.

16. The method of claim 11 wherein the first magnetic layer is not etched during the etching of the second magnetic layer and the non-magnetic layer.

17. The method of claim 16 wherein the non-magnetic layer is physically against the first magnetic layer, and wherein the second magnetic layer is physically against the non-magnetic layer.

18. The method of claim 11 wherein the etch process is an ion milling process.

19. The method of claim 11 wherein the protective material comprises silicon.

20. The method of claim 11 wherein the protective material comprises carbon.

21. The method of claim 11 wherein the protective material comprises germanium.

22. The method of claim 11 wherein the protective material comprises silicon nitride.

23. The method of claim 11 wherein the first and second magnetic layers comprise one or more of nickel, iron, cobalt, iridium, manganese, platinum and ruthenium.

24. The method of claim 11 further comprising:
   providing a semiconductor substrate;
   forming an insulative material over the semiconductor substrate;
   forming a barrier layer over the insulative material;
   forming a magnetic pinning layer over the barrier layer; and
   wherein the first magnetic layer is formed over the magnetic pinning layer.

25. The method of claim 24 wherein the barrier layer comprises tantalum, the magnetic pinning layer comprises iron and nickel; the first magnetic layer comprises iron and cobalt, the second magnetic layer comprises nickel and iron, and the non-magnetic layer comprises aluminum oxide.

26. The method of the claim 11 wherein the first and second magnetic layers comprise identical chemical compositions to one another.

27. The method of claim 11 wherein the non-magnetic layer comprises an electrically insulative material.

28. The method of claim 11 wherein the non-magnetic layer comprises aluminum oxide.

29. The method of claim 11 wherein the non-magnetic layer comprises an electrically conductive material.

30. A method of forming a magnetoresistive device, comprising:
   forming a stack comprising a first magnetic layer, a non-magnetic layer over the first magnetic layer, and a second magnetic layer over the non-magnetic layer;
   forming a patterned mask over the stack;
   etching the second magnetic layer and non-magnetic layer with an ion milling process in a reaction chamber to pattern the second magnetic layer and non-magnetic layer into a mass having an outer peripheral shape defined by the patterned mask; and
   while the stack remains in the reaction chamber, depositing a protective material to a thickness of at least 50 Å over at least a portion of the outer peripheral shape.

31. The method of claim 30 wherein the outer peripheral shape is defined as a sidewall, and further comprising anisotropically etching the protective material to form the protective material into at least one sidewall spacer along the sidewall.

32. The method of claim 30 wherein the first magnetic layer is not etched during the etching of the second magnetic layer and the non-magnetic layer.

33. The method of claim 30 wherein the protective material is deposited to a thickness of less than about 1000 Å.

34. The method of claim 30 wherein the protective material comprises silicon.

35. The method of claim 30 wherein the protective material comprises carbon.

36. The method of claim 30 wherein the protective material comprises germanium.

37. The method of claim 30 wherein the protective material comprises silicon nitride.

38. The method of claim 30 wherein the non-magnetic layer comprises an electrically insulative material.

39. The method of claim 30 wherein the non-magnetic layer comprises aluminum oxide.

* * * * *